(12) United States Patent
Gruhlke et al.

(10) Patent No.: US 7,195,387 B2
(45) Date of Patent: Mar. 27, 2007

(54) DEVICE AND METHOD FOR EMITTING LIGHT WITH INCREASED BRIGHTNESS USING DIFFRACTIVE GRATING PATTERN

(75) Inventors: Russell W. Gruhlke, Fort Collins, CO (US); Wong Lye Ye, Penang (MY); Yaw Yean Chon, Perak (MY)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 237 days.

(21) Appl. No.: 10/638,716

(22) Filed: Aug. 11, 2003

(65) Prior Publication Data

US 2005/0036319 A1 Feb. 17, 2005

(51) Int. Cl.
*F21V 7/04* (2006.01)
(52) U.S. Cl. .................. 362/555; 362/311; 359/566; 359/574; 359/575; 257/98
(58) Field of Classification Search ............... 362/311, 362/326, 555, 556, 582; 257/98; 438/666; 359/566, 574, 575
See application file for complete search history.

(56) References Cited

U.S. PATENT DOCUMENTS

| | | | | |
|---|---|---|---|---|
| 5,339,225 A | * | 8/1994 | Wiggerman | .................. 362/477 |
| 6,196,691 B1 | * | 3/2001 | Ochiai | .................. 362/617 |
| 6,610,598 B2 | * | 8/2003 | Chen | .................. 438/666 |
| 2002/0131275 A1 | * | 9/2002 | Yamamoto et al. | .................. 362/555 |

* cited by examiner

*Primary Examiner*—Stephen F Husar

(57) ABSTRACT

A device and method for emitting light with increased brightness utilizes a lamp having a diffractive grating pattern. The diffractive grating pattern diffracts incident light that originates from a light source toward a light output region of the lamp. The diffraction of the incident light causes more of the light to impinge the light output region of the lamp at desired angles. This reduces the angular distribution of the light emitted from the light output region as output light. The reduction in angular distribution of emitted light results in an increased brightness of the device.

16 Claims, 8 Drawing Sheets

DEVICE AND METHOD FOR EMITTING LIGHT WITH INCREASED BRIGHTNESS USING DIFFRACTIVE GRATING PATTERN

FIELD OF THE INVENTION

The invention relates generally to light emitting devices and more particularly to a device and method for emitting light with increased brightness.

BACKGROUND OF THE INVENTION

A light emitting diode (LED) typically includes a base, a light emitting die and a lamp. The light emitting die is positioned on the base and embedded in the lamp. The light generated by the light emitting die is transmitted through the lamp and emitted from the lamp as output light.

A significant goal in designing an LED is to increase the brightness of the LED. Brightness is optically defined as the amount of flux or power emitted from an area into a solid angle (brightness=flux/(area×solid angle)). One approach to increase the brightness of an LED is to use a light emitting die having higher emission efficiency. The higher emission efficiency of the light emitting die increases the flux, which results in an increased brightness of the LED. A concern with this approach is that the use of such a light emitting die may not be cost-effective for mass-production of LEDs.

Another approach to increase the brightness of an LED is to use the geometrical shape of the lamp. For example, the lamp may be shaped to include a convex region on top of a cylindrical body. The convex region functions as a lens to reduce the angular divergence of the emitted light from the light emitting die, which increases the brightness of the LED. However, the effectiveness of such a lamp on the brightness of the LED depends on the amount of light that reaches the convex region of the lamp at desired angles. The light that reaches the convex region of the lamp at large diverging angles may not contribute to the reduction of angular divergence of emitted light. Since the light generated by the light emitting die is initially emitted in all directions, more light will reach the convex region of the lamp at desired angles if the convex region is enlarged. However, such a modification of the lamp may be constrained by miniaturization requirements of LEDs for common applications.

In view of these concerns, what is needed is a device and method for emitting light with increase brightness that is cost-effective and can satisfy miniaturization requirements for common applications.

SUMMARY OF THE INVENTION

A device and method for emitting light with increased brightness utilizes a lamp having a diffractive grating pattern. The diffractive grating pattern diffracts incident light that originates from a light source toward a light output region of the lamp. The diffraction of the incident light causes more of the light to impinge the light output region of the lamp at desired angles. This reduces the angular distribution of the light emitted from the light output region as output light. The reduction in angular distribution of emitted light results in an increased brightness of the device.

A light emitting device in accordance with an embodiment of the invention includes a light source and a transparent lamp. The transparent lamp is optically coupled to the light source to receive the light from the light source. The transparent lamp has a light output region through which the received light is emitted as output light. The transparent lamp includes a diffractive grating pattern to diffract light incident thereon toward the light output region of the transparent lamp.

A method for emitting light in accordance with an embodiment of the invention includes generating light such that the generated light has an angular distribution; circumferentially diffracting the light in a portion of the angular distribution toward a light output region, and emitting the light in the light output region as output light.

Other aspects and advantages of the present invention will become apparent from the following detailed description, taken in conjunction with the accompanying drawings, illustrated by way of example of the principles of the invention.

DETAILED DESCRIPTION

Figure 1:
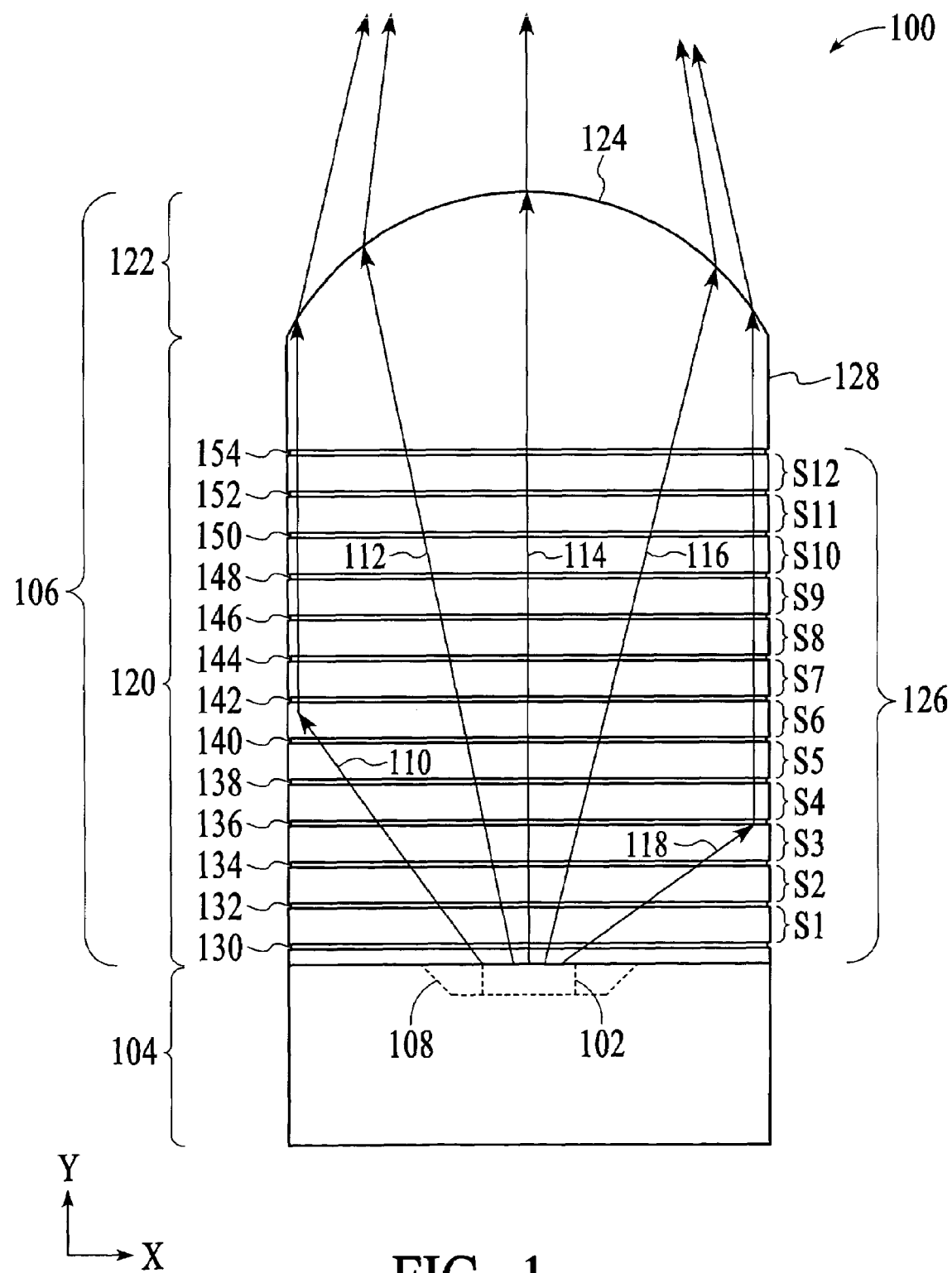
FIG. 1 is a diagram of a light emitting device having a diffractive grating pattern with equal spacings in accordance with an embodiment of the invention.

With reference to FIG. 1, a light emitting device 100 in accordance with an embodiment of the invention is shown. The device 100 includes an internal light source 102 that generates light that is emitted from the device as output light. The light generated by the light source 102 may include visible, ultraviolet and/or infrared light. The device 100 is designed to reduce the angular distribution of the emitted light by selectively diffracting some of the light generated by the light source 102. The reduced angular distribution of the emitted light results in an increased brightness of the device 100.

As shown in FIG. 1, the device includes a base 104, the light source 102 and a lamp 106. The light source 102 and the lamp 106 are disposed over the base 104. The base 104 may include a reflective surface 108 to reflect some of the light emitted by the light source 102 away from the base so that the reflected light can be emitted from the device 100 as useful output light. The light source 102 may be a light emitting die of a light emitting diode (LED). However, the light source 102 may be any light generating device. The light generated by the light source 102 is emitted from the light source in different directions, as illustrated by exemplary emission paths 110, 112, 114, 116 and 118 in FIG. 1.

Figure 2:
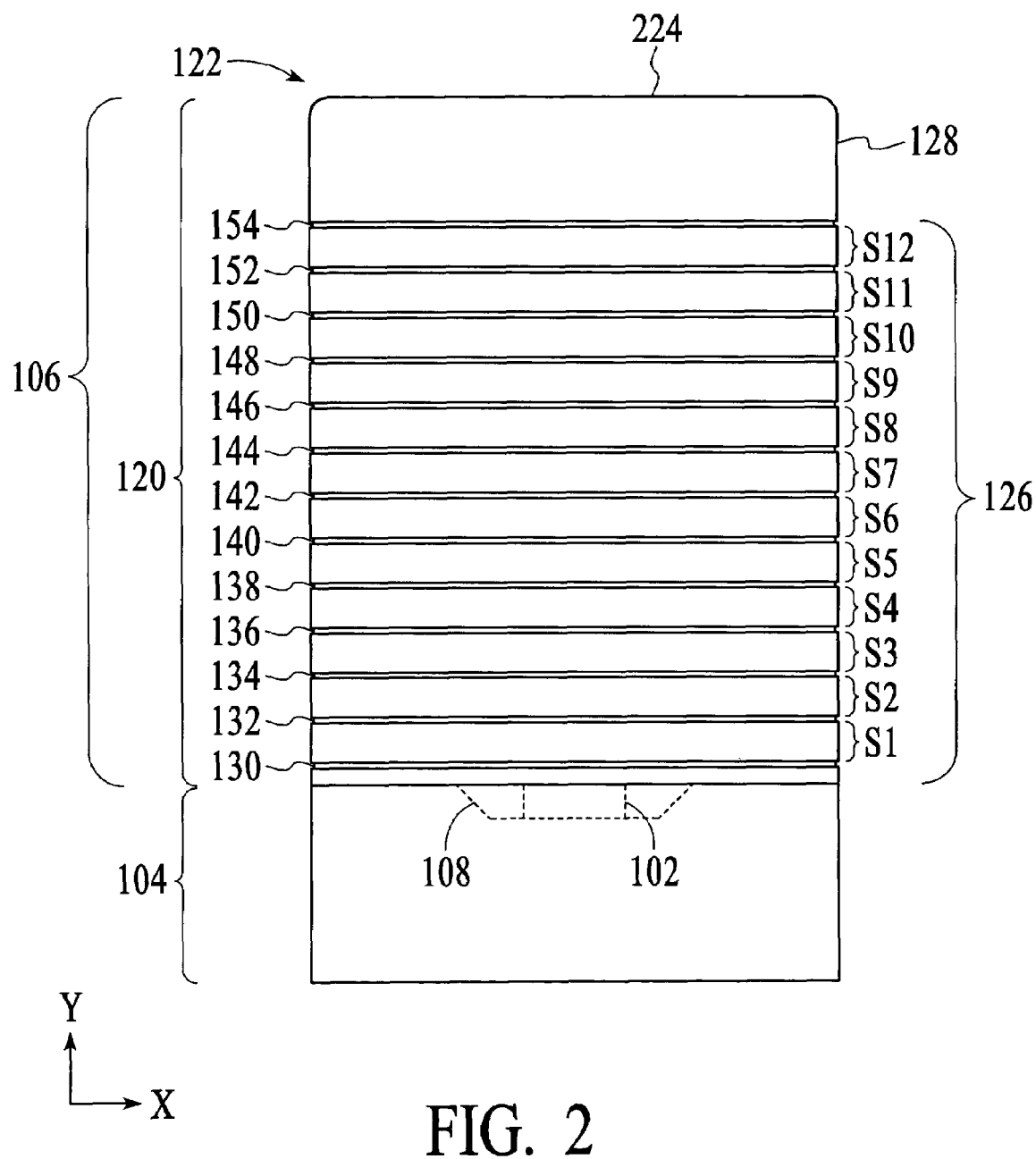
FIG. 2 is a diagram of the light emitting device of FIG. 1 that includes a lamp having a light output region with a flat surface.

The lamp 106 of the device 100 is a solid element that may encapsulate the light source 102. The lamp 106 is made of a transparent material so that the light emitted by the light source 102 is transmitted through the lamp. As an example, the lamp 106 may be made of epoxy. The lamp 106 includes a main region 120 and a light output region 122. The lamp 106 is attached to the base 104 such that the main region 120 is situated between the base and the light output region 122. The main region 120 of the lamp 106 is cylindrical in shape. However, in other embodiments, the main region 120 of the lamp may be rectangular solid in shape. In the illustrated embodiment of FIG. 1, the light output region 122 of the lamp 106 has a convex surface 124. However, as shown in FIG. 2, the light output region 122 may have a flat surface 224. The configuration selected for the light output region 122 is typically based on the application of the light emitting device 100.

In the illustrated embodiment of FIG. 1, the convex surface 124 of the light output region 122 functions as a lens to focus the light emitted by the light source 102 that is emitted from the device 100 as output light. Focusing the light reduces the angular divergence of the emitted light, which increases the brightness of the device 100. However, light that impinges the convex surface 124 of the light output region 122 at certain angles may not be not focused by the light output region, and thus, decreases the brightness of the device 100.

The lamp 106 of the device 100 allows more of the light emitted by the light source 102 to impinge the convex surface 124 of the light output region 122 at small angles with respect to the axis of symmetry. This axis is parallel to the Y-axis shown in FIG. 1. The lamp 106 includes a diffractive grating pattern 126 located on the side surface 128 of the main region 120. The diffractive grating pattern 126 functions as a diffraction grating to diffract light emitted by the light source 102 that is incident on the diffractive grating pattern, such as the light traveling on the emission paths 110 and 118. The exterior of the lamp 106 in the region of the diffractive grating pattern 126 may be metallized to make it reflective and increase diffraction efficiency. The incident light is diffracted toward the light output region 122 of the lamp 106 such that some of the diffracted light impinges the convex surface 124 of the light output region 122 at the desired small angles with respect to the axis of symmetry. Thus, more of the light emitted by the light source 102 will be focused by the convex surface 124 of the light output region 122. Consequently, the angular distribution of the emitted light is reduced, which increases the brightness of the device 100.

The diffractive grating pattern 126 of the lamp 106 comprises a number of parallel circumferential microstructures. In an embodiment, the circumferential microstructures are circumferential grooves formed in the side surface 128 of the lamp 106, as illustrated in FIG. 1 by the circumferential grooves 130, 132, 134, 136, 138, 140, 142, 144, 146, 148, 150, 152 and 154. In order to simplify the drawings, the number of circumferential grooves shown is only a small fraction of the number of circumferential grooves in a real light emitting device. In actuality, the diffractive grating pattern 126 may include hundreds or thousands of circumferential grooves. The grooves 130–154 are separated by spacings S1, S2, S3, S4, S5, S6, S7, S8, S9, S10, S11 and S12, respectively. Each spacing is measured in a direction parallel to the Y-axis from the centers of the adjacent grooves. Each of the circumferential grooves 130–154 is located in a plane that is orthogonal to the Y-axis. In other words, the circumferential grooves 140–154 are orthogonal to the axis of symmetry of the lamp 106. Thus, in an embodiment in which the main region 120 of the lamp 106 is cylindrical in shape, the grooves 130–154 are annular indentations in the surface 128 of the lamp 106.

The transparent lamp 106 may be fabricated by injecting epoxy into a mold with annular protuberances that correspond to the shape of the circumferential grooves 130–154. Preferably, the mold is designed to be separated so that the injection-molded lamp can be easily extracted from the mold. The injection-molded lamp can then be attached to the base 104 with the light source 102 to form the light emitting device 100.

Figure 3:
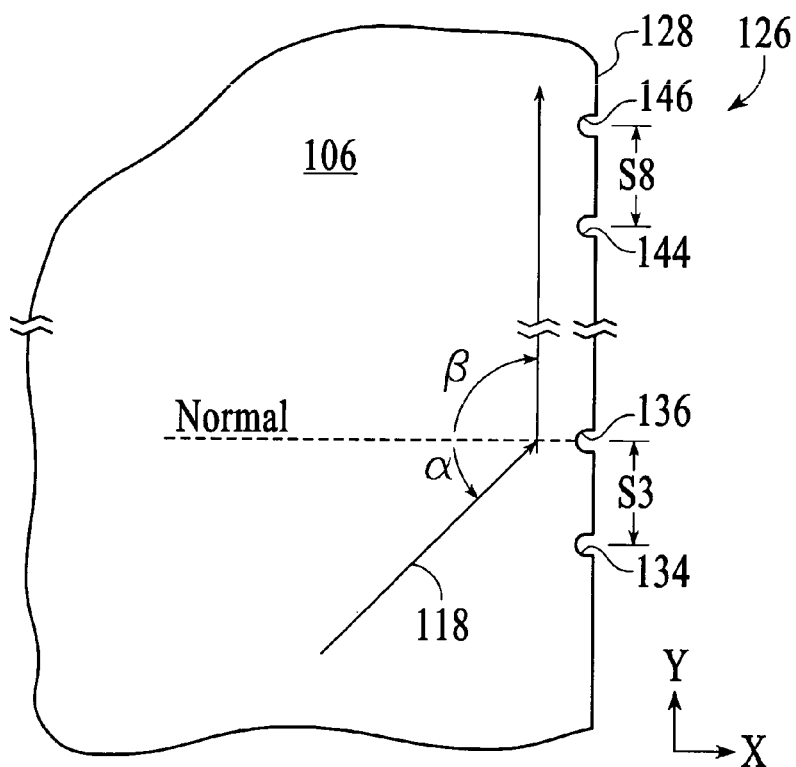
FIG. 3 is an enlarged diagram of a portion of the diffractive grating pattern of the light emitting device of FIG. 1 in accordance with an embodiment of the invention.
Figure 4A:
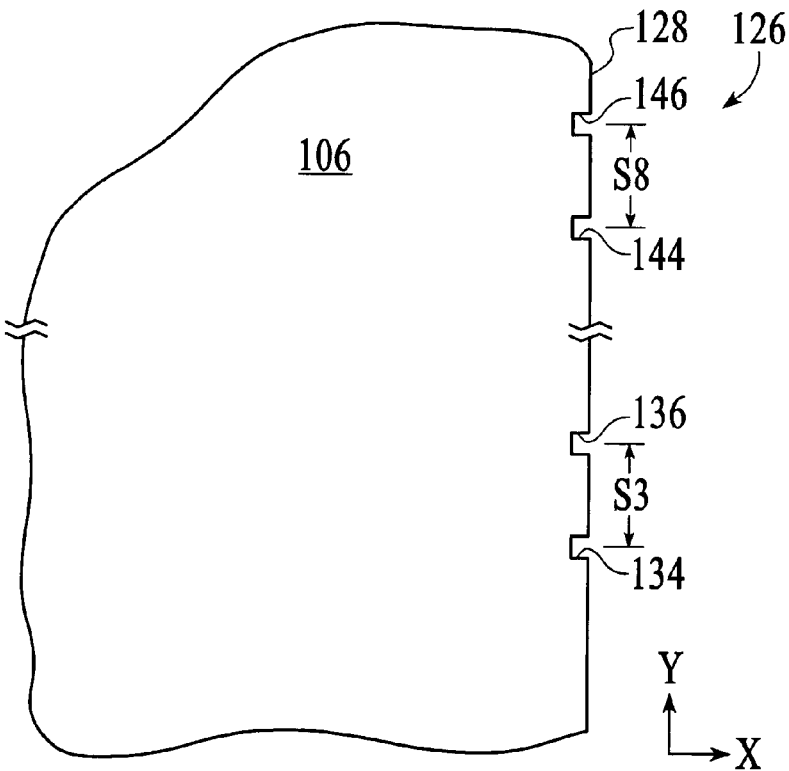
FIG. 4A is another enlarged diagram of a portion of the diffractive grating pattern of the light emitting device of FIG. 1, illustrating circumferential grooves of the diffractive grating pattern with rectangular profile.
Figure 4B:
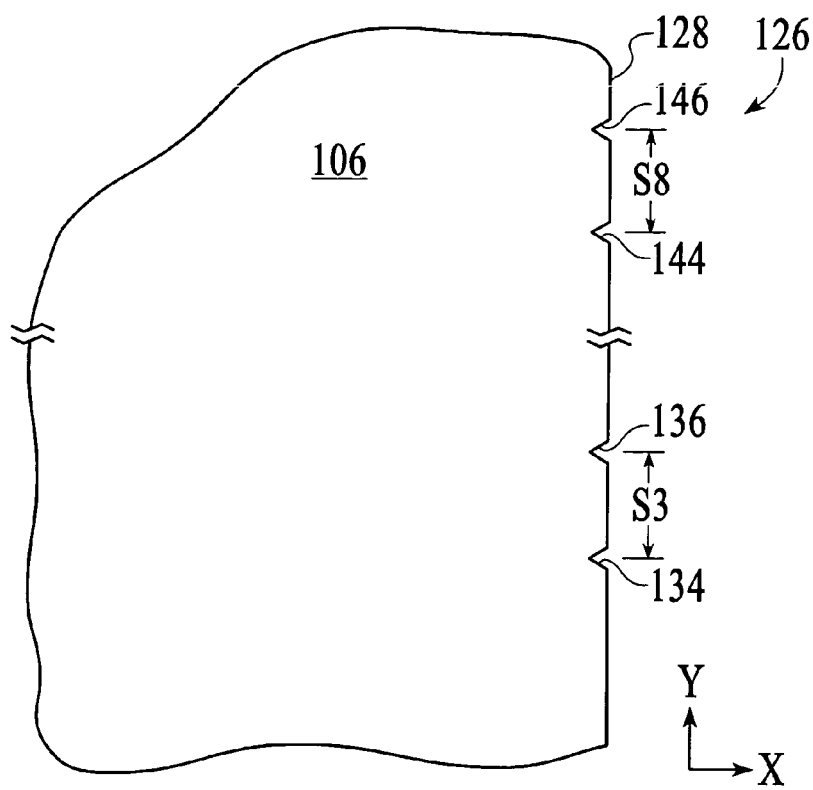
FIG. 4B is another enlarged diagram of a portion of the diffractive grating pattern of the light emitting device of FIG. 1, illustrating circumferential grooves of the diffractive grating pattern with triangular profile.
Figure 4C:
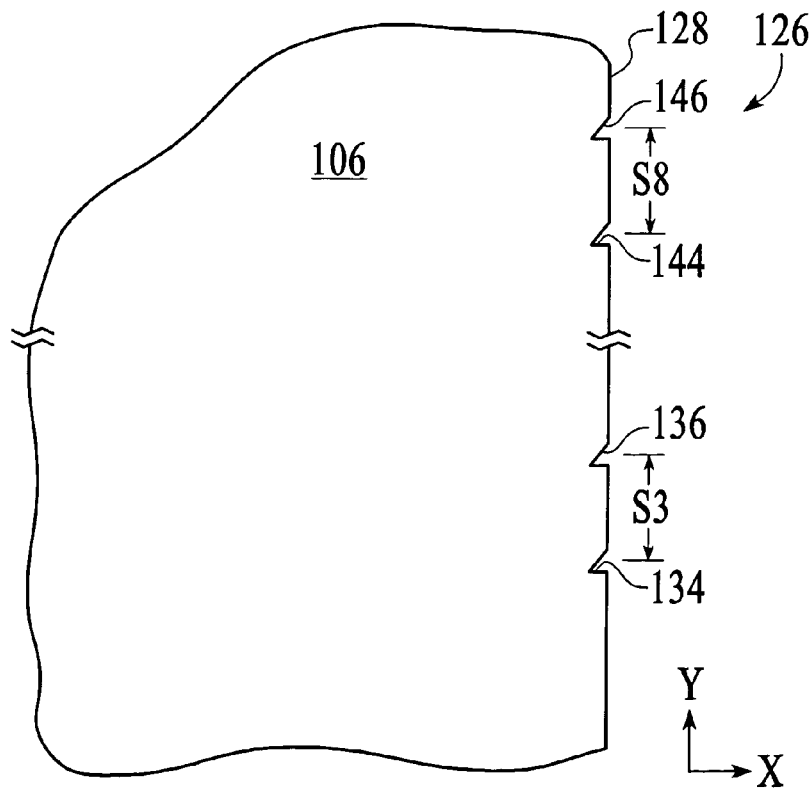
FIG. 4C is another enlarged diagram of a portion of the diffractive grating pattern of the light emitting device of FIG. 1, illustrating circumferential grooves of the diffractive grating pattern with sawtooth profile.

In FIG. 3, a portion of the lamp 106 is shown, illustrating the circumferential grooves 134, 136, 144 and 146 of the diffractive grating pattern 126. As illustrated by the circumferential grooves 134, 136, 144 and 146 shown in FIG. 3, each circumferential groove of the diffractive grating pattern 126 may be configured to have a C-shaped profile. A diffraction grating with such a grating pattern is commonly referred to as a "sinusoidal" grating. However, the diffractive grating pattern 126 may be configured such that the circumferential grooves 130–154 have a different profile. As an example, each circumferential groove of the diffractive grating pattern 126 may be configured to have a rectangular profile, as illustrated in FIG. 4A. A diffraction grating with such a grating pattern is commonly referred to as a "ruled" grating. As another example, each circumferential groove of the diffractive grating pattern 126 may be configured to have a triangular profile, as illustrated in FIG. 4B. As another example, each circumferential groove of the diffractive grating pattern 126 may be configured to have a sawtooth profile, as illustrated in FIG. 4C. A diffraction grating with such a grating pattern is commonly referred to as a "blazed" grating. A blazed grating diffracts most of the incident light into a particular diffraction order, usually the +1 or the −1 diffraction order. Thus, the diffraction efficiency of a blazed grating is greater than the diffraction efficiency of a sinusoidal or ruled grating.

As shown in FIG. 3, light traveling along the emission path 118 is diffracted by the diffractive grating pattern 126 of the lamp 106. The angle of diffraction for incident light on the diffractive grating pattern 126 is governed by the following diffraction equation.

$$\sin\alpha \pm \sin\beta = \frac{\pm n\lambda}{T},$$

where $\alpha$ is the angle of incidence, $\beta$ is the angle of diffraction, n is the order of diffraction, $\lambda$ is the wavelength of the incident light, and T is the period of the diffraction grating, i.e., the spacings of the diffractive grating pattern 106. Thus, the angle of diffraction is dependent on the angle of incidence and the spacings of the diffractive grating pattern 106. As used herein, angles of incidence or diffraction are defined from a line that is normal to the side surface 128 of the lamp 106 in the clockwise direction, as illustrated in FIG. 3. Thus, positive and negative ninety degrees will coincide with the positive and negative directions along the Y-axis, respectively.

The diffractive grating pattern 126 of the lamp 106 is designed to diffract light emitted by the light source 102 that is incident on the diffractive grating pattern, such as the light traveling along the emission paths 110 and 118, toward the light output region 122 of the lamp, as shown in FIGS. 1 and 3. Thus, the diffractive grating pattern 126 circumferentially diffracts the light generated by the light source 102, which is initially emitted in different directions, so that more light reaches the light output region 122 of the lamp 106. In the illustrated embodiment of FIG. 1, the spacings S1–S12 separating the circumferential grooves 130–154 are equal. That is, each groove is equidistant from adjacent grooves. The equal spacings S1–S12 may be statistically determined to optimize the brightness of the device 100. As an example, the equal spacings S1–S12 may be set such a significant amount of the diffracted light propagates in a direction substantially parallel to the Y-axis. In other words, the spacings S1–S12 of the diffractive grating pattern 126 are set such that a significant amount of the diffracted light has a diffraction angle that is approximately positive ninety degrees.

However, the increase in brightness is constrained by the fact that the angle of incidence for an incident light will differ at different locations on the diffractive grating pattern 126. Since the incident light originates from a fixed location of the light source 102 and the distance along the surface 128 is perpendicular to the plane on which the light source is located, the angle of incidence will increase as the light impinges on locations on the diffractive grating pattern 126 further from the light source. Thus, if the spacings S1–S12 are equal, the incident light at locations on the diffractive grating pattern 126 closer to the base 104 will have smaller angles of incidence, which will increase the angles of diffraction. As described below, these variations in angles of incidence can be compensated by varying the spacings S1–S12 of the diffractive grating pattern 126.

Figure 5:
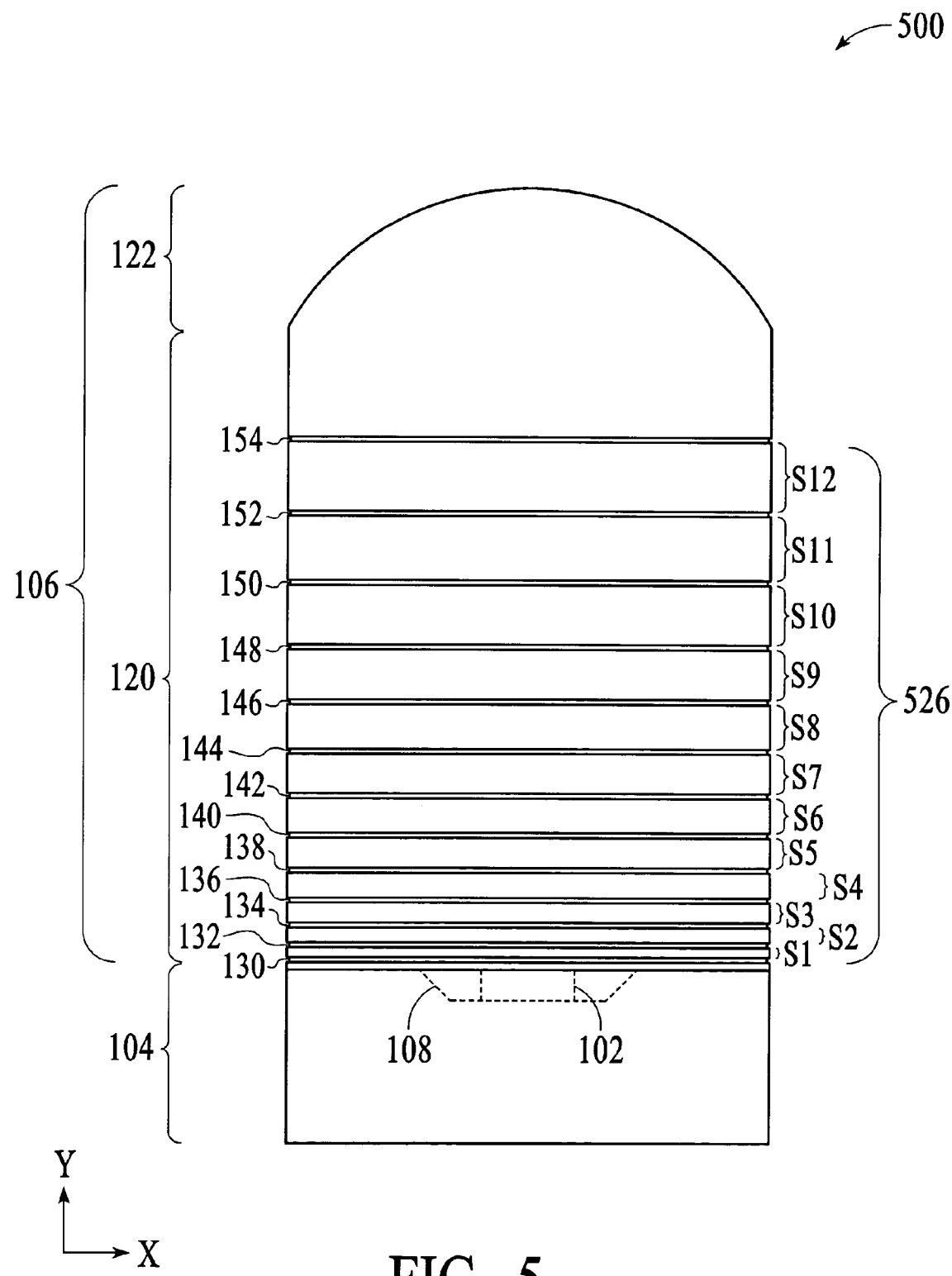
FIG. 5 is a diagram of a light emitting device having a diffractive grating pattern with increasing spacings in accordance with an embodiment of the invention.

In an embodiment of the invention as shown by a light emitting device 500 of FIG. 5, the spacings S1–S12 of a diffractive grating pattern 526 depend on the distance between the respective spacing and the base 104. The spacings S1–S12 gradually increase with increasing distance of the spacing from the base 104. Thus, the spacing S2 is greater than the spacing S1, the spacing S3 is greater than the spacing S2, and so on. The gradual increase in the spacings S1–S12 is based on the fact that the angles of incidence generally increase for incident light as the light impinges on the diffractive grating pattern 526 at increasing distances from the base 104. As an example, the angles of incidence for light that impinges on the diffractive grating pattern 526 near the spacing S8 are generally greater than the angles of incidence for light that impinges on the diffractive grating pattern near the spacing S3.

The increase in the angles of incidence is compensated for by a corresponding increase in the spacings S1–S12 of the diffractive grating pattern 526. Thus, light is diffracted by the diffractive grating pattern 526 with an angle of incidence-dependent dispersivity. The varying spacings S1–S12 can be determined by using the diffraction equation. However, the angles of incidence for light that impinges on the diffractive grating pattern 526 at the same location are not the same because light is emitted from different areas of the light source 102. Thus, there are slight variations in the angles of incidence for light that is incident on the diffractive grating pattern 526 at a common location. The spacings S1–S12 can be determined using a statistical analysis to ensure that a significant portion of incident light is diffracted in the desired direction.

Figure 6:
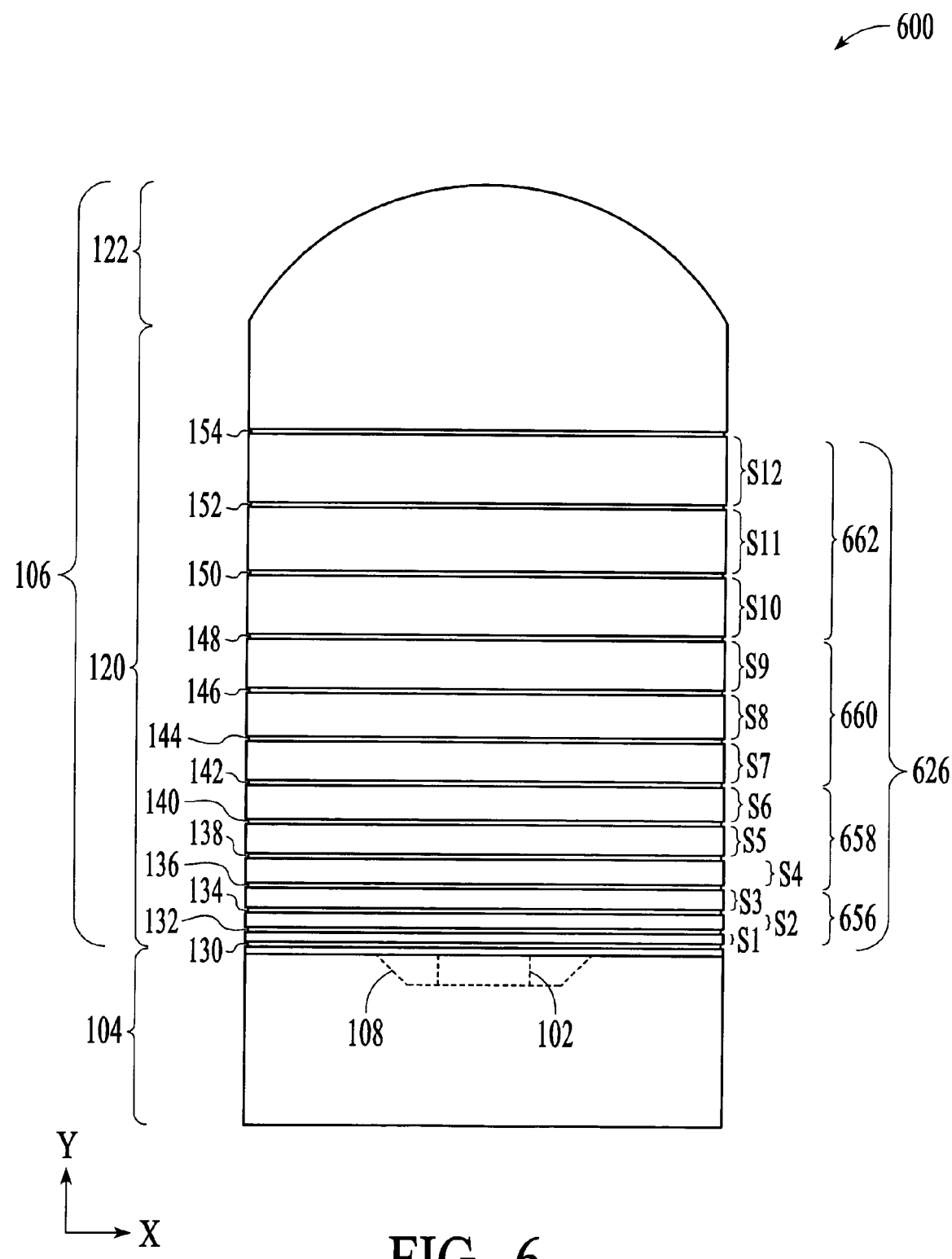
FIG. 6 is a diagram of a light emitting device having a diffractive grating pattern with groups of different spacings in accordance with an embodiment of the invention.

In another embodiment of the invention as shown by a light emitting device 600 of FIG. 6, the spacings S1–S12 of a diffractive grating pattern 626 differ among four groups 656, 658, 660 and 662 of spacings. The number of groups 656, 658, 660 and 662 of spacings included in the diffractive grating pattern 626 can vary from two to five or more, and is only limited by the number of spacings included in the diffractive grating pattern. Moreover, each group of spacings may include any number of spacings.

In the illustrated embodiment, the first group 656 includes the spacings S1, S2 and S3 that are all equal to L1. The second group 658 includes the spacings S4, S5 and S6 that are all equal to L2. The third group 660 includes the spacings S7, S8 and S9 that are all equal to L3. The fourth group 662 includes the spacings S10, S11 and S12 that are all equal to L4. The spacings L1, L2, L3 and L4 of the spacing groups 656, 658, 660 and 662 increase with increasing distance of the respective spacing group from the base 104. Thus, the spacing L2 of the spacing group 658 is greater than the spacing L1 of the spacing group 656, the spacing L3 of the spacing group 660 is greater than the spacing L2, and the spacing L4 of the spacing group 662 is greater than the spacing L3. The increase in the spacings L1, L2, L3 and L4 is also based on the fact that the angles of incidence generally increase for incident light as the light impinges on the diffractive grating pattern 626 at increasing distances from the base 104. As an example, the angles of incidence for light that impinges on the diffractive grating pattern 626 at the second group 660 of spacings S7, S8 and S9 are generally greater than the angles of incidence for light that impinges on the diffractive grating pattern at the first group 656 of spacings S1, S2 and S3.

The increase in the angles of incidence is compensated for by corresponding increase in the spacings L1, L2, L3 and L4 of the spacing groups 656, 658, 660 and 662. The spacings L1, L2, L3 and L4 can be determined by applying a statistical analysis to the diffraction equation so that a significant portion of incident light is diffracted in the desired direction.

Figure 7:
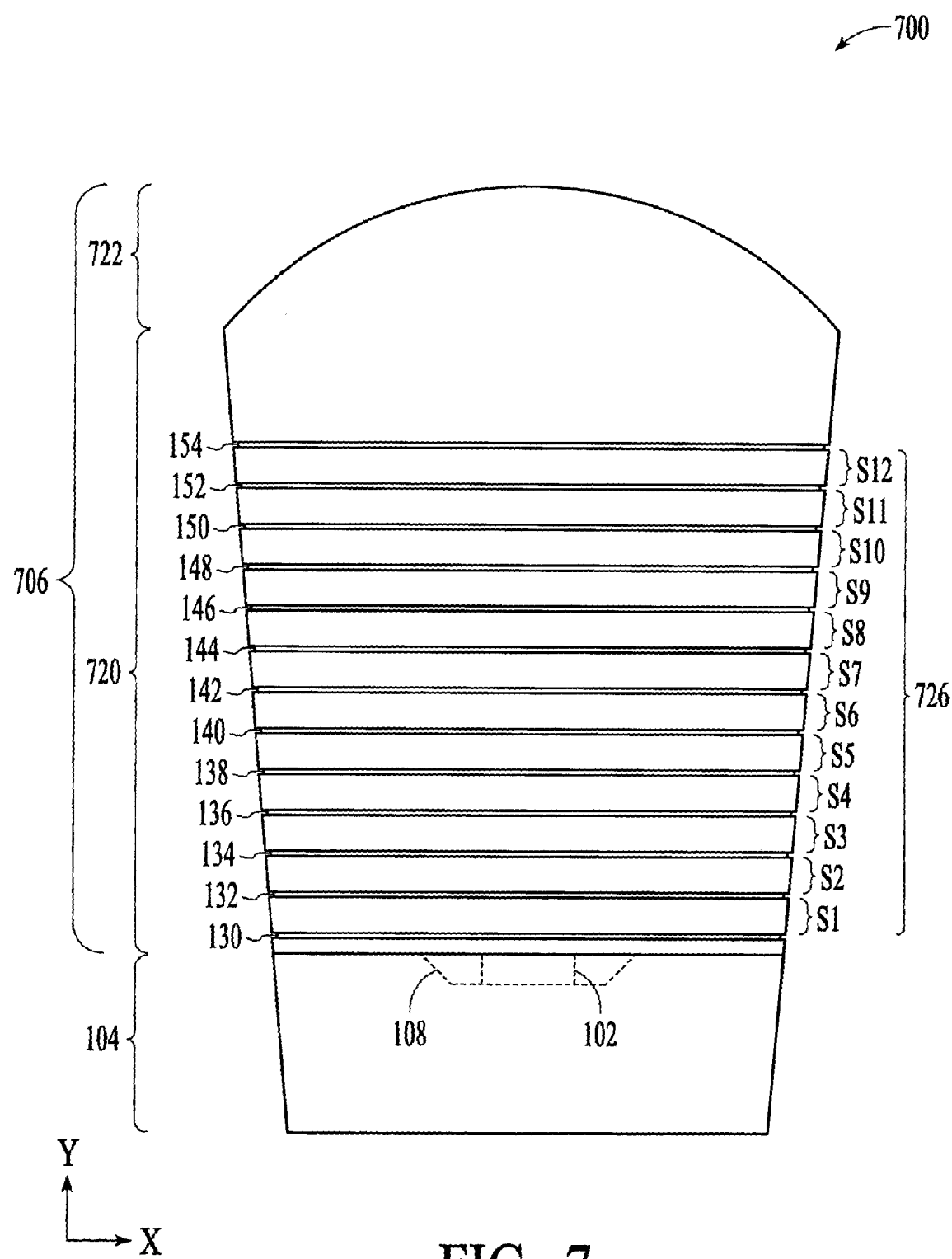
FIG. 7 is a diagram of a light emitting device having a frusto-conical lamp in accordance with an alternative embodiment of the invention.

Turning now to FIG. 7, a light emitting device 700 in accordance with an alternative embodiment is shown. The device 700 includes a lamp 706 having a main region 720 and a light emitting region 722. In this alternative embodiment, the main region 720 of the lamp 706 is frusto-conical in shape. Thus, the radius of the main body 720 gradually increases with increasing distance from the base 104. Consequently, the light output region 722 is larger than the light output region 122 of the lamp 106 of the light emitting device 100, 500 and 600. The lamp 706 includes a diffractive grating pattern 726 that is similar to the diffractive grating pattern 126 of the light emitting device 100. However, the diffractive grating pattern 726 may alternatively be similar to the diffractive grating pattern 526 of the light emitting device 500 or the diffractive grating pattern 626 of the light emitting device 600.

Although the circumferential grooves 130–154 of the grating patterns 126, 526, 626 and 726 of the light emitting device 100, 500, 600 and 700 have been illustrated and described herein as being oriented orthogonally to the axis of symmetry of the lamps 106 and 706, the circumferential grooves may be configured such that portions of the circumferential grooves are not orthogonal to the axis of symmetry. As an example, in an embodiment in which the main region 120 of the lamp 106 is rectangular solid in shape, the circumferential grooves 130–154 on each side of the main region may include a central section that is parallel to a plane orthogonal to the axis of symmetry of the lamps 106 and 706 and side sections near the corners of the main region that are tilted relative to that plane. Thus, with this configuration, incident light is diffracted away from the corners of the main region 120, which may further reduce the angular distribution of the emitted light.

Furthermore, although the grating patterns 126, 526, 626 and 726 of the light emitting device 100, 500, 600 and 700 have been illustrated and described herein as including circumferential grooves, in another embodiment, the grating patterns may include circumferential protuberances as the circumferential microstructures that form the grating pattern. Similar to the circumferential grooves, these circumferential protuberances may have a C-shaped, rectangular, triangular or sawtooth profile. In addition, the circumferential protuberances may include portions that are not orthogonal to the axis of symmetry of the lamps 106 and 706. The diffractive properties of such a grating pattern with circumferential protuberances is similar to that of the grating patterns 126, 426, 626 and 726 with circumferential grooves 130–154.

Figure 8:
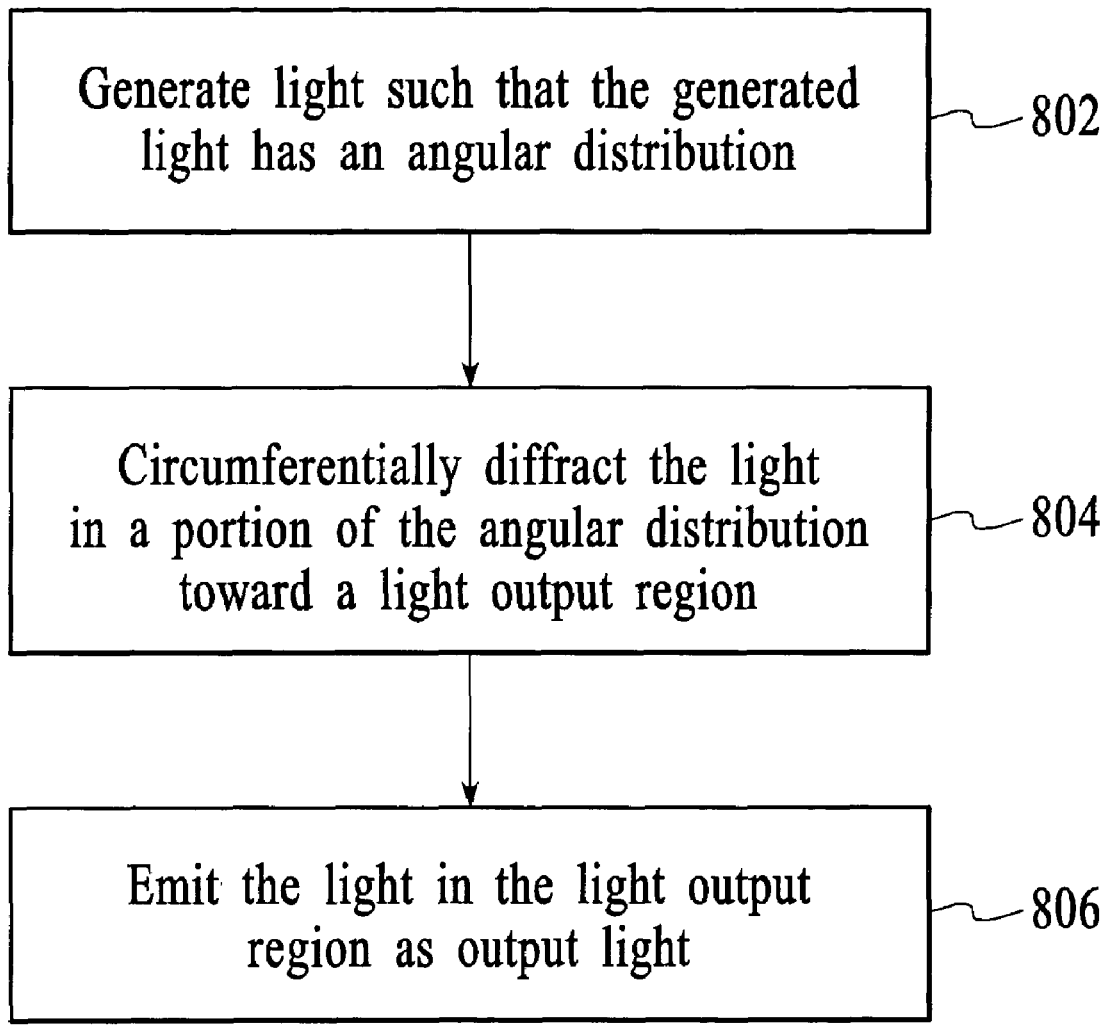
FIG. 8 is a process flow diagram of a method for emitting light with increased brightness in accordance with an embodiment of the invention.

A method for emitting light with increased brightness in accordance with an embodiment of the invention is described with reference to the flow diagram of FIG. 8. At block 802, light is generated such that the generated light has an angular distribution. As an example, the light may be generated from a light emitting die of an LED. Next, at block 804, the light in a portion of the angular distribution is circumferentially diffracted toward a light output region. As an example, the light may be diffracted by a diffractive grating pattern of circumferential grooves or protuberances on the side surface of a transparent lamp toward a light output region of the lamp. Next, at block 806, the light in the light output region is emitted as output light.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A light emitting device comprising:
   a light emitting die; and
   a transparent lamp optically coupled to said light emitting die to receive said light therefrom, said transparent lamp being configured to encapsulate said light emitting die, said transparent lamp including:
      a light output region through which said light is emitted as output light; and
      a diffractive grating pattern to diffract said light incident thereon toward said light output region, wherein said diffractive grating pattern includes circumferential grooves located on a side surface of said transparent lamp, said circumferential grooves being separated by respective spacings.

2. The device of claim 1, wherein said circumferential grooves have a profile selected from a C-shaped profile, a rectangular profile, a triangular profile and a sawtooth profile.

3. The device of claim 1, wherein at least two of said spacings differ from one another.

4. The device of claim 3, wherein said spacings include first and second spacings, said second spacing being located further from said light source than said first spacing, said second spacing being greater than said first spacing.

5. The device of claim 3, wherein said spacings include a first set of equal spacings and a second set of equal spacings, said second set of equal spacings being located further from said light source than said first set of equal spacings, said equal spacings of said second set being greater than said equal spacings of said first set.

6. The device of claim 1, wherein said transparent lamp includes a frusto-conical region.

7. The device of claim 1, wherein said light output region of said transparent lamp includes a convex surface.

8. A light emitting device comprising:
   a base;
   a light emitting die disposed over said base; and
   a transparent lamp optically coupled to said light emitting die to receive light therefrom, said transparent lamp being attached to said base and configured to encapsulate said light emitting die, said transparent lamp including:
      a light output region through which said light is emitted as output light; and
      a diffractive grating pattern on a side surface of said transparent lamp to diffract said light incident thereon toward said light output region, wherein said diffractive grating pattern includes parallel circumferential grooves that are separated by respective spacings.

9. The device of claim 8, wherein said parallel circumferential grooves have a profile selected from a C-shaped profile, a rectangular profile, a triangular profile and a sawtooth profile.

10. The device of claim 8, wherein at least two of said spacings differ from one another.

11. The device of claim 10, wherein said spacings include first and second spacings, said second spacing being located further from said light source than said first spacing, said second spacing being greater than said first spacing.

12. A method for emitting light, said method comprising:
   generating light from a light emitting die, said light having an angular distribution;
   circumferentially diffracting said light in a portion of said angular distribution within a transparent lamp at circumferential grooves located on a side surface of said transparent lamp toward a light output region of said transparent lamp, said transparent lamp being configured to encapsulate said light emitting die; and
   emitting said light in said light output region as output light.

13. The method of claim 12, wherein said circumferentially diffracting includes circumferentially diffracting said light in said portion of said angular distribution to reduce said angular distribution thereof.

14. The method of claim 12, wherein said circumferentially diffracting includes selectively diffracting said light in said portion of said angular distribution at different diffraction angles.

15. The method of claim 12, wherein said circumferentially diffracting said light includes diffracting said light in said portion of said angular distribution with an angle of incidence-dependent dispersivity.

16. The method of claim 12, wherein said emitting of said light includes focusing said light to reduce said angular distribution of said light.

* * * * *